(12) United States Patent
Rueb et al.

(10) Patent No.: US 7,868,396 B2
(45) Date of Patent: Jan. 11, 2011

(54) POWER SEMICONDUCTOR COMPONENT WITH A DRIFT ZONE AND A HIGH-DIELECTRIC COMPENSATION ZONE AND METHOD FOR PRODUCING A COMPENSATION ZONE

(75) Inventors: Michael Rueb, Faak am See (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 327 days.

(21) Appl. No.: 11/700,555

(22) Filed: Jan. 31, 2007

(65) Prior Publication Data

US 2007/0200183 A1 Aug. 30, 2007

(30) Foreign Application Priority Data

Jan. 31, 2006 (DE) ........................ 10 2006 004 405

(51) Int. Cl.
*H01L 29/76* (2006.01)
(52) U.S. Cl. ................ 257/401; 257/335; 257/336; 257/337; 257/338; 257/339; 257/340; 257/341; 257/342; 257/343; 257/344; 257/345; 257/346; 257/347; 257/348; 257/349; 257/E27.112; 257/E29.147
(58) Field of Classification Search ................ 257/341, 257/401, 335–349, E27.112, E29.147
See application file for complete search history.

(56) References Cited

FOREIGN PATENT DOCUMENTS

| DE | 102004007197 A1 | 1/2005 |
| WO | WO 2005/078802 | * 8/2005 |
| WO | WO 2005/078802 A3 | 8/2005 |

OTHER PUBLICATIONS

Morrison et al. "Ferroelectric Nanotubes." Rev.Ad.Mater.Sci.4 Advanced Study Center Co. Ltd, 2003. pp. 114-122. (9 Pages).
Hilton et al. "Dielectric Properties of Ba1-xSrxTiOc ceramics." J. Phys. D: Appl. Phys.29. IOP Publishing Ltd, 1996. pp. 1321-1325. (5 Pages).

* cited by examiner

*Primary Examiner*—Cuong Q Nguyen
*Assistant Examiner*—Trang Q Tran
(74) *Attorney, Agent, or Firm*—Maginot, Moore & Beck LLP

(57) ABSTRACT

A power semiconductor component includes a drift zone in a semiconductor body, a component junction and a compensation zone. The component junction is disposed between the drift zone and a further component zone, which is configured such that when a blocking voltage is applied to the component junction, a space charge zone forms extending generally in a first direction in the drift zone. The compensation zone is disposed adjacent to the drift zone in a second direction and includes at least one high-dielectric material having a temperature-dependent dielectric constant. The temperature dependence of the compensation zone varies in the second direction.

21 Claims, 12 Drawing Sheets

FIG 2 A-A
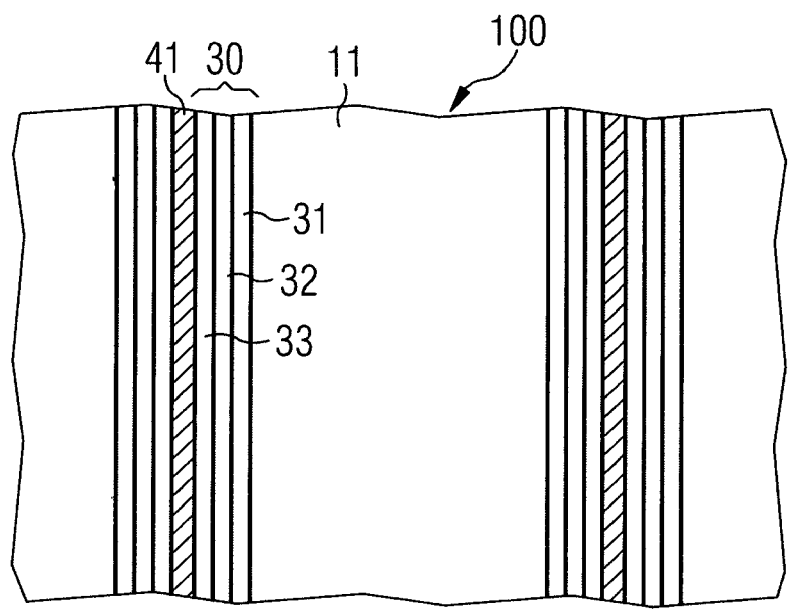
FIG 3 A-A
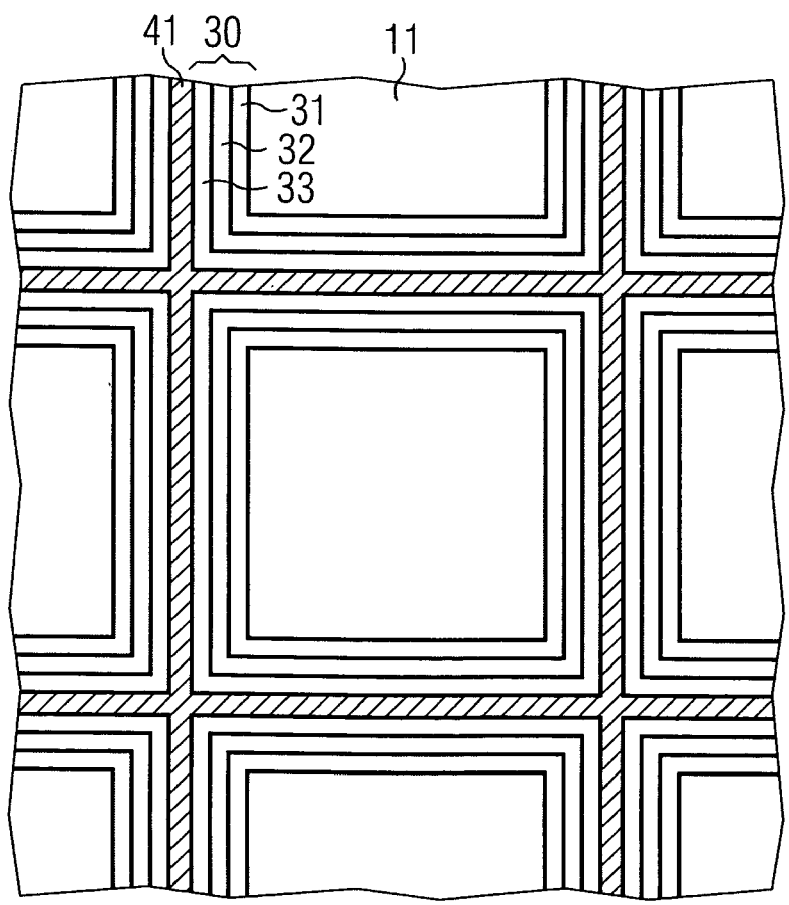

B-B

C-C

US 7,868,396 B2

POWER SEMICONDUCTOR COMPONENT WITH A DRIFT ZONE AND A HIGH-DIELECTRIC COMPENSATION ZONE AND METHOD FOR PRODUCING A COMPENSATION ZONE

TECHNICAL BACKGROUND

The present invention relates to a power semiconductor component, in particular a unipolar power semiconductor component, with a drift zone and a compensation zone made of a high-dielectric (high-k) material extending along the drift zone.

The drift zone of a power semiconductor component, for example of a power MOSFET, serves in a known manner to take up an electric field when a blocking voltage is present. In this connection, the on resistance of the component and the with-stand voltage thereof are dependent on the dimensions of the drift zone and the dopant concentration present in the drift zone. In this case, it holds true—if no additional measures are implemented—that the on resistance is all the lower, the shorter the drift zone in a current flow direction and the higher the doping concentration thereof. Conversely, however, the withstand voltage of the component also decreases with shortening of the drift zone and an increase in the dopant concentration.

With a component driven in the off state, providing a compensation zone made of a high-dielectric material effects a compensation of part of the dopant charge present in the drift zone due to the doping. This compensation effect is caused by a strong polarization of the high-dielectric compensation zone, with the polarization charges hereby compensating for dopant charges in the drift zone. For a given blocking voltage, this compensation effect reduces the electric field strength in the drift zone in the current flow direction, so that, for the same dielectric strength, the doping concentration of the drift zone can be increased in comparison with conventional components in order thereby to reduce the on resistance.

For the realization of power components, suitable high-dielectric materials have the disadvantage that the dielectric constant is greatly dependent on the temperature. Referring to Hilton et al.: "Dielectric Properties of $Ba_{1-x}Sr_xTiO_3$ ceramics", J. Phys. D: Appl. Phys. 29 (1996) 1321-1325, by way of example, the relative permittivity $\in_r$ of $Ba_{0.7}Sr_{0.3}TiO_3$ is $\in_r=5000$ at a temperature of T=300 K and decreases by a factor of 10 to $\in_r=500$ in the event of a rise in the temperature to T=450 K. For the application of said material as a compensation zone in a power semiconductor component this means that the compensation charge decreases by the factor of 10 in a manner corresponding to the relative permittivity in the event of a rise in temperature from 300 K to 450 K, which leads to a reduction of the dielectric strength of the component. Consequently, the dielectric strength of the component is greatly dependent on the temperature.

This great temperature dependence of the relative permittivity of high-dielectric materials is problematic in particular because power components have to be fully functional over a wide temperature range, for example from −55° C. (218 K) to 150° C. (423 K).

SUMMARY

A first embodiment of the invention is a power semiconductor component that includes a drift zone in a semiconductor body, a component junction and a compensation zone. The component junction is disposed between the drift zone and a further component zone, which is configured such that when a blocking voltage is applied to the component junction, a space charge zone forms extending generally in a first direction in the drift zone. The compensation zone is disposed adjacent to the drift zone in a second direction and includes at least one high-dielectric material having a temperature-dependent dielectric constant. The temperature dependence of the compensation zone varies in the second direction.

BRIEF DESCRIPTION OF THE DRAWINGS

The present invention is explained in more detail below with reference to figures.

FIG. 2 illustrates one possibility for the realization of the power MOSFET in accordance with FIG. 1, in which the compensation zone is arranged in trenches of a semiconductor body that run in strip-type fashion.

FIG. 3 illustrates a further possibility for the realization of the power MOSFET in accordance with FIG. 1, in which the compensation zone is arranged in trenches in the semiconductor body that run in grid-type fashion.

DETAILED DESCRIPTION OF THE DRAWINGS

Figure 1A:
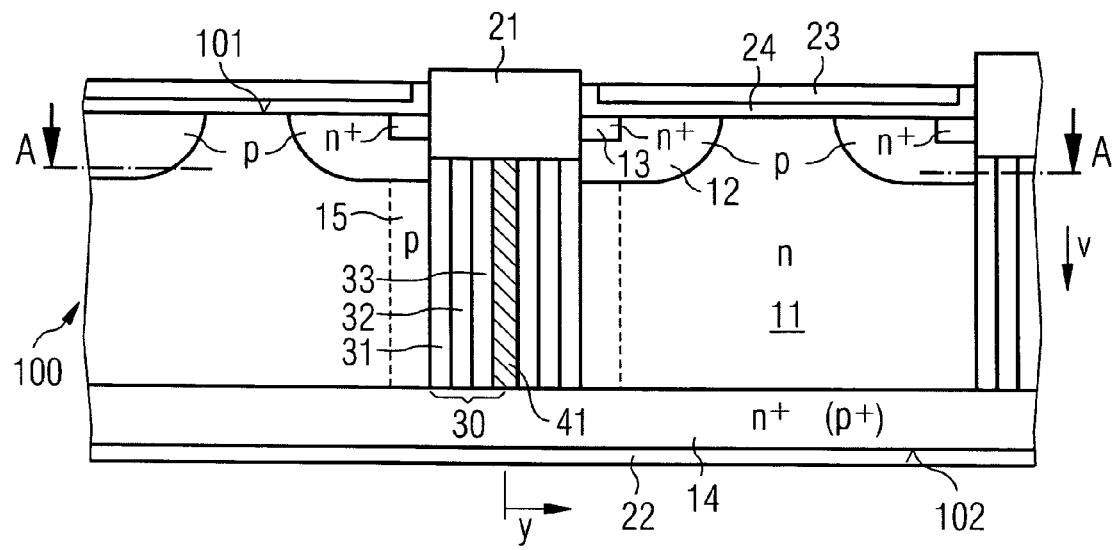
FIG. 1 shows a cross section through a vertical power MOSFET having a high-dielectric compensation zone with a spatially varying temperature behavior of the dielectric constant.

In the figures, unless specified otherwise, identical reference symbols designate identical component regions with the same meaning.

A power semiconductor component according to an embodiment of the invention has a semiconductor body with a drift zone of a first conductivity type, and a junction between the drift zone and a further component zone, said further component zone being configured in such a way that when a blocking voltage is applied to the junction, a space charge zone forms in a first direction in the drift zone. The component additionally has a compensation zone, which is arranged adjacent to the drift zone in the second direction and which has a high-dielectric material having a temperature-dependent dielectric constant. The compensation zone is configured in such a way that the temperature dependence of the dielectric constant varies in the second direction.

The compensation zone of the power semiconductor component according to an embodiment the invention is not homogeneous and therefore has sections with differing temperature behavior of the dielectric constant. At least two sections with differing temperature behavior of the dielectric constants are necessary. These dielectric constants of the at least two sections may have a mutually opposite temperature behavior, that is to say that one of the dielectric constants has a positive temperature coefficient, while the other of the dielectric constants has a negative temperature coefficient, with the result that the total dielectric constant, when considered over a predefined temperature range, is subject to smaller fluctuations than would be the case when using only a homogeneous material, and ideally is at least approximately constant.

The compensation zone may have at least one layer stack having at least two layers which are arranged adjacent to one another in the second direction and which in each case comprise high-dielectric materials, the dielectric constants of which have different temperature coefficients. Furthermore, there is also the possibility of providing in the compensation zone a plurality of such layer stacks which are arranged adjacent to one another in the second direction.

A composite material whose composition changes continuously in the second direction may also be used as the high-dielectric material. This is equivalent to a number of extremely thin dielectric layers each having a different composition being arranged adjacent to one another in the second direction. In this case, the composition is varied in such a way that the temperature behaviors of the dielectric constants of the individual very thin layers differ from one another.

Dielectric materials whose dielectric constant is greater than 50, preferably greater than 200, are regarded as high-dielectric materials in connection with the present application. Suitable dielectric materials are for example perovskite ceramics, such as barium titanate (BT), strontium titanate (ST) or barium strontium titanate (BST). Further suitable materials are hafnium oxide ($HfO_2$), zirconium oxide ($ZrO_2$), titanium dioxide ($TiO_2$) or lanthanum oxide ($La_2O_3$). The dielectric constants of said high-dielectric materials have different temperature dependencies, in which case, by combining at least two of these materials, in particular two materials having a mutually opposite temperature behavior of the dielectric constants, a compensation zone is obtained whose dielectric constant, over a predefined temperature range, is subject to small fluctuations and is ideally approximately constant.

The high-dielectric compensation zone may directly adjoin the drift zone. Furthermore, there is also the possibility of arranging a further dielectric layer between the compensation zone and the drift zone. Such a layer serves for example as a barrier that prevents a reaction of the high-dielectric material with the semiconductor material of the drift zone or prevents said high-dielectric material from diffusing into the drift zone.

The junction proceeding from which a space charge zone propagates in the drift zone upon application of a blocking voltage is, for example, a pn junction or a Schottky junction or a Schottky contact.

The power semiconductor component according to the invention may be embodied, in particular, as a power MOSFET, as a power pn diode, as a power Schottky diode or as a junction FET (JFET).

In the case of a power MOSFET, the further component zone is a body zone doped complementarily with respect to the drift zone. A power MOSFET additionally comprises a drain zone, which adjoins the drift zone at a side remote from the body zone, a source zone, which is separated from the drift zone by the body zone, and also a gate electrode, which is arranged adjacent to the body zone and which is insulated from the body zone by means of a gate dielectric. In this case, the gate electrode and the gate dielectric may be arranged above a side of the semiconductor body or in a trench extending into the semiconductor body.

In the case of a power Schottky diode, the further component zone is a Schottky metal zone. The Schottky diode additionally has a cathode zone, which adjoins the drift zone at a side remote from the Schottky metal zone.

In the case of a power pn diode (bipolar diode), the further component zone is an anode zone, while a cathode zone adjoins a side of the drift zone that is remote from the anode zone.

In the case of a JFET, the further component zone is a gate zone, which forms a pn junction with the drift zone and which serves to pinch off a channel between the drift zone and a source zone of the JFET upon application of a suitable voltage.

The power semiconductor component according to the invention may be realized both as a vertical component and as a lateral component.

In the case of a vertical component, the first direction corresponds to a vertical direction of the semiconductor body, while the second direction corresponds to a lateral direction of the semiconductor body.

In the case of a lateral component, the drift zone runs in the lateral direction of the semiconductor body, so that the first direction corresponds to the lateral direction of said semiconductor body, while the second direction corresponds to the vertical direction of the semiconductor body or a further lateral direction of the semiconductor body running perpendicular to the first direction.

FIG. 1A shows a cross section through a power semiconductor component according to an embodiment the invention, with the power semicomponent being a vertical power transistor in the present case. The component comprises a semiconductor body 100 having a first side 101, which is referred to hereinafter as the front side, and a second side 102, which is referred to hereinafter as the rear side. A drift zone 11 of a first conductivity type is present in the semiconductor body 100, said drift zone adjoining, in a first direction, a body zone 12 doped complementarily with respect to the drift zone 11. Said first direction corresponds to a vertical direction v of the semiconductor body 100 in the example illustrated.

A pn junction is formed between the drift zone 11 and the body zone 12. Proceeding from the pn junction a space charge zone propagates in the vertical direction in the drift zone 11 when the component is driven in the off state and blocking voltage is present. The power MOSFET additionally comprises a source zone 13 of the first conductivity type, which is separated from the drift zone 11 by the body zone 12, and also a drain zone 14 of the first conductivity type, which adjoins the drift zone 11 at a side remote from the body zone 12 and is doped more heavily than the drift zone 11.

A gate electrode 23 is present for controlling an inversion channel in the body zone 12. The gate electrode 12, in the example, is arranged as a planar electrode above the front side 101 of the semiconductor body 100 and is insulated from the semiconductor body 100 by a gate dielectric.

In the case of an n-conducting power MOSFET (as illustrated), the drift zone 11, the source zone 13 and the drain zone 14 are n-doped, while the body zone 12 is p-doped. In the case of a p-conducting power MOSFET, said semiconductor zones are correspondingly complementarily doped.

In the case of the power MOSFET illustrated, the source zone 13 and the body zone 12 are jointly contacted by a source electrode 21, which extends in sections over the front side 101 into a trench of the semiconductor body. The drain zone 14 is contact-connected by a drain electrode 22 applied to the rear side 102. The two electrodes 21, 22 comprise a metal, for example, such as aluminum, for example.

The n-type power MOSFET illustrated turns off if a positive voltage is present between the drain and source electrodes 22, 21 and if no suitable drive potential for forming an inversion channel is present at the gate electrode 23. In this case, proceeding from the pn junction between the body zone 12 and the drift zone 11, a space charge zone propagates in the drift zone 11, in the region of said space charge zone positively charged donor cores being present in the drift zone 11, which, with corresponding opposite charges present in the body zone 12, bring about an electric field running in the vertical direction of the semiconductor body. In order to reduce the gradient of the electric field propagating in the vertical direction and thus, for a given doping of the drift zone, to extend the space charge zone by a multiple further into the drift zone, a compensation zone 30 made of a high-dielectric material is arranged adjacent to the drift zone 11. In the example, said compensation zone 30 is arranged in a trench below the source electrode 21 and extends in the vertical direction of the semiconductor body 100 as far as the drain zone 14. In this case, the compensation zone 30 is contact-connected both by the source electrode 21 and by the drain zone 14. As an alternative to a connection of the compensation zone 30 to the source electrode 21, the compensation zone 30 may also be connected to the gate electrode 23 or gate potential (not illustrated) or a further auxiliary potential.

The material used for realizing the compensation zone 30 is chosen such that its relative permittivity is greater than 50, preferably greater than 200. On account of this high dielectric constant, the compensation zone 30 is very highly polarized, the polarization charges thereby generated compensating for part of the dopant charge present in the drift zone 11 in order thereby to reduce the gradient of the electric field in the vertical direction v of the semiconductor body 100 in the off-state case.

Suitable materials for realizing the compensation zone 30 are, for example, hafnium oxide ($HfO_2$), zirconium dioxide ($ZrO_2$), titanium dioxide ($TiO_2$) or lanthanum oxide ($La_2O_3$).

Further suitable materials are titanates, such as, for example, barium titanate ($BaTiO_3$, BT), strontium titanate ($SrTiO_3$, ST) or barium strontium titanate ($BaSrTiO_3$, BST). Zirconates, niobates, or tantalates are also suitable as high-dielectric material for realizing the compensation zone.

The dielectric constant of high-dielectric materials is temperature-dependent, said dielectric constant in each case assuming a maximum value at a specific temperature for each of the various materials and in each case decreasing for temperatures below and above said specific temperature. In the case of ferroelectric dielectrics, this temperature at which the maximum value of the dielectric constant is present is referred to as the Curie point.

In order to achieve, within a predetermined temperature range, which for example corresponds to the use temperature range of the power MOSFET, a smaller fluctuation of the dielectric constant or ideally a total dielectric constant of the compensation zone 30 that is at least approximately constant within said temperature range, the compensation zone 30 is constructed inhomogeneously from different high-dielectric materials in such a way that the temperature dependence of the dielectric constant varies within the compensation zone 30 in a second direction running perpendicular to the vertical direction v. In the example, said second direction is a lateral direction of the semiconductor body, which in the example runs perpendicular to an interface between the compensation zone 30 and the drift zone 11.

In the exemplary embodiment illustrated in FIG. 1, a variation of the temperature dependence of the dielectric constant of the compensation zone 30 is achieved by virtue of the compensation zone having three dielectric layers 31, 32, 33 which are arranged adjacent to one another in the second direction and which comprise different high-dielectric materials and the dielectric constants of which have different temperature dependencies. In connection with the present invention, "different temperature dependencies" is to be understood to mean, in particular, that the temperatures at which the individual materials have their respective maximum value of the relative permittivity, i.e. the Curie point in the case of ferroelectrics, differ from one another.

The invention makes use of the fact that a layer stack comprising layers having different dielectric materials having different Curie points has a total dielectric constant whose temperature-dependent profile is "smoothed" in comparison with the temperature-dependent profiles of the dielectric constants of the individual layers. In this case, by selecting suitable dielectric materials, it is possible to establish a temperature-dependent profile of the dielectric constants in such a way that the dielectric constant, within a desired temperature range corresponding to the use temperature of the component, is subject to only small fluctuations and is preferably approximately constant.

Figure 1B:
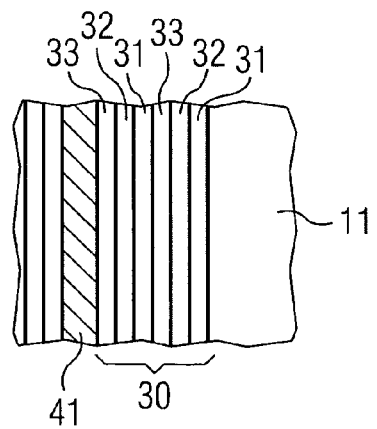

In the example in accordance with FIG. 1, three different dielectric layers 31, 32, 33 are applied to the side walls of the trench. Said layers can be produced for example after the production of the trench (not illustrated) by means of a CSD method (CSD=Chemical Solution Deposition). The reference symbol 41 in FIG. 1 designates a filling material, for example an oxide, with which the trench is filled after deposition of the dielectric layers at the side walls. Instead of only one layer stack having a plurality—in the example three—of layers composed of different dielectric materials, there is also the possibility, referring to FIG. 1B, of arranging a plurality of such layer stacks successively in the second direction. FIG. 1B shows an excerpt of a compensation zone 30 with a plurality—in the example two—of such layer stacks comprising in each case a plurality—in the example three—of layers.

In the example illustrated in FIG. 1A, the layer stack is only arranged on side walls of the trench. Such a layer stack structure can be achieved by the bottom of the trench being uncovered after deposition of each individual layer of the layer stack, for example by means of an anisotropic etching method, before the respective next layer of the stack is deposited.

The power MOSFET illustrated is constructed in a cellular manner and comprises in each case a multiplicity of identically constructed transistor cells each having a source zone 13, a body zone 12 and also a drift zone 11. In this case, the drain zone 14 is common to all of the transistor cells. In this case, the individual transistor cells may be realized as so-called strip cells, the compensation zones 30, referring to FIG. 2, in each case being arranged here in trenches running parallel to one another.

Referring to FIG. 3, the transistor cells may also be realized as square cells, the compensation zone here being arranged in trenches which are formed in grid-like fashion and between which run in each case drift zone sections having a square geometry in plan view. It goes without saying that any further geometries, in particular any polygonal geometries, such as, for example, a hexagonal geometry, of the cutouts of the grid-type trench structure and hence of the transistor cells can be realized.

A first layer 31 of the layer stack of the compensation zone 30 as illustrated in FIG. 1A comprises for example $SrTiO_3$, a second layer 32 comprises for example $Ba_xSr_{1-x}TiO_3$, where x=0.5, and a third layer 33 of the layer stack comprises for example $BaTiO_3$. $Ba_xSr_{1-x}TiO_3$ generally denotes a barium strontium titanate containing barium with a proportion x and strontium with a proportion 1−x, based in each case on the proportion of barium plus strontium. $Ba_xSr_{1-x}TiO_3$ is abbreviated below to BST(x;1−x).

The compensation zone explained above may be interpreted as a compensation zone composed of barium strontium titanate in which the proportion of barium and strontium varies in the second direction, which is designated as the y-direction in FIG. 1A. In this case, barium titanate (BT) is synonymous with BST(1;0) and strontium titanate (ST) is synonymous with BST(0;1).

Figure 4:
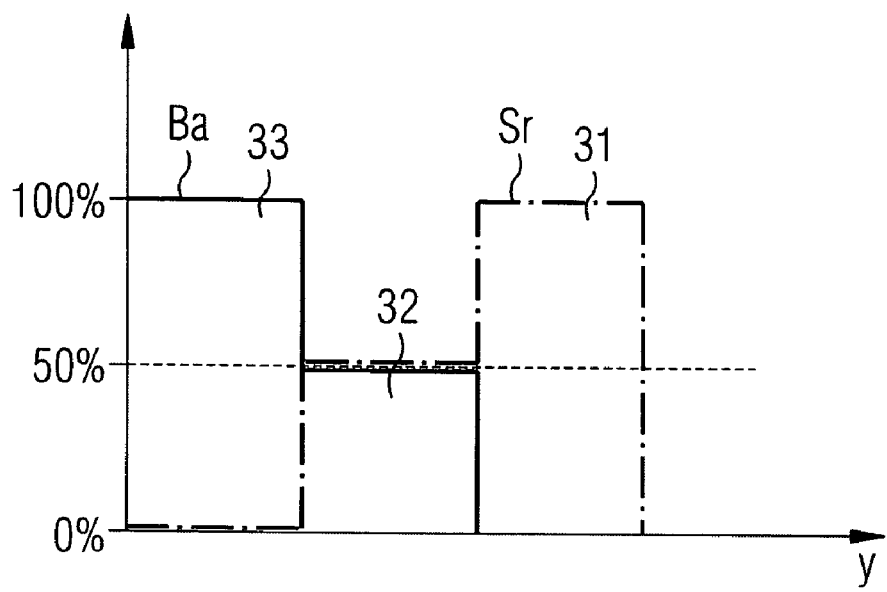
FIG. 4 illustrates the construction of the compensation zone in the case of a first exemplary embodiment.

FIG. 4 illustrates, for the example explained above, the proportion of barium and strontium in the barium strontium titanate of the compensation zone 30 in the y-direction. In this case, the solid line denotes the proportion of barium, which is x=1 (100%) in the third layer 33, x=0.5 (50%) in the second layer 32 and x=0 in the first layer 31. The dash-dotted line denotes the proportion of strontium, which is 1−x=0 in the third layer 33, 1−x=0.5 (50%) in the second layer 32, and 1−x=1 (100%) in the first layer 31. The different proportions of barium and strontium in the individual layers 31, 32, 33 lead to different temperature dependencies of the dielectric constants.

Figure 6:
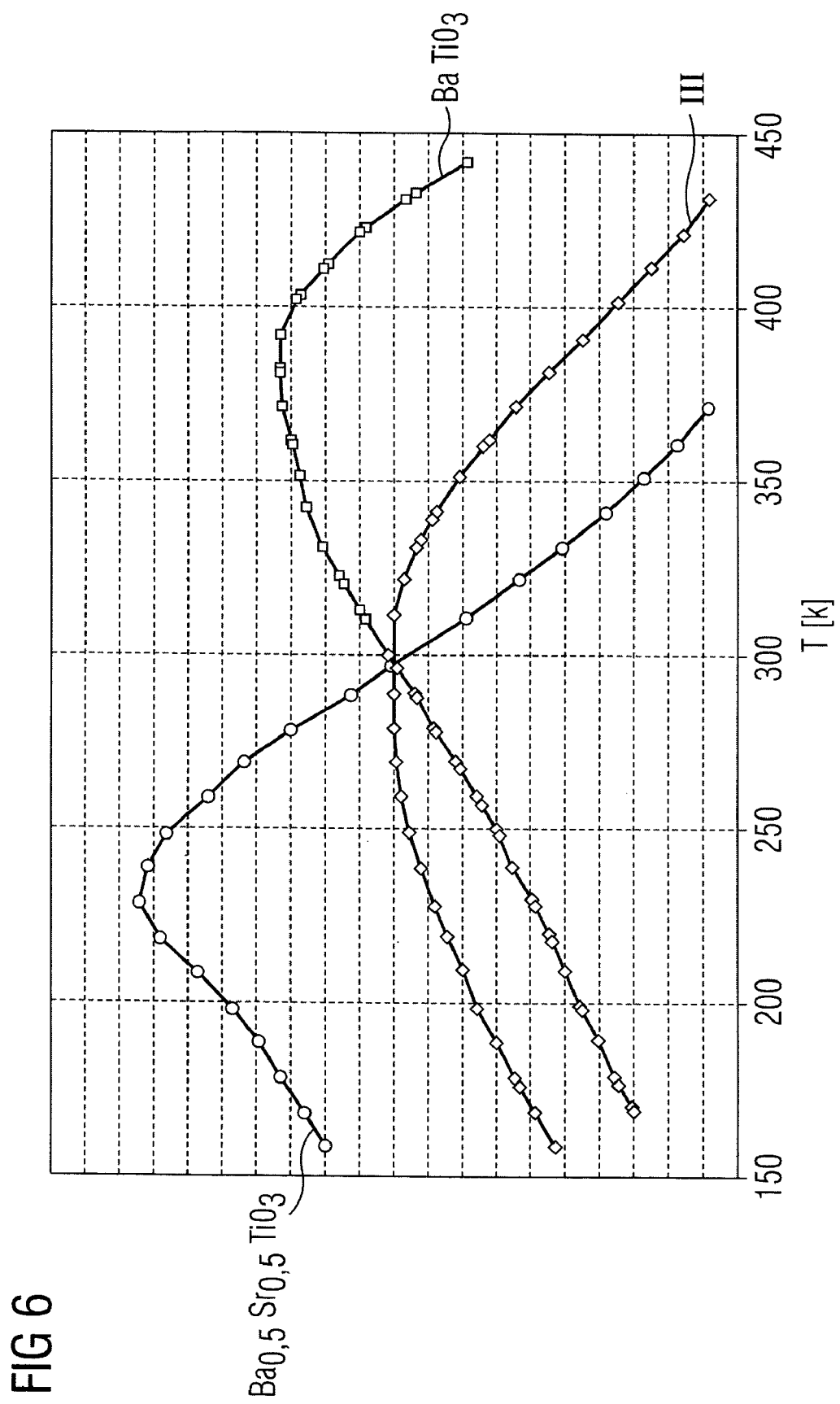
FIG. 6 qualitatively shows the temperature-dependent profile of the dielectric constant of two homogeneous compensation zones and a compensation zone with spatially varying composition.

In FIG. 6, the relative permittivities of BT and BST(0.5; 0.5) are plotted qualitatively over a temperature range of 150 K to 450 K. This reveals that the Curie point of BT is approximately 400 K and that of BST (0.5;0.5) is approximately 230 K. The Curie point of the profile (not illustrated) of ST is approximately 20 K. Just by combining only three layers composed of different dielectric materials, such as BT, ST and BST(0.5;0.5), for example, it is possible to achieve a total dielectric constant of the compensation zone 30 whose temperature profile is significantly flattened compared with the temperature profiles of the dielectric constants of the individual materials within a predetermined temperature range, in particular within the temperature range from 220 K to 450 K that is of particular interest for power components.

Figure 5:
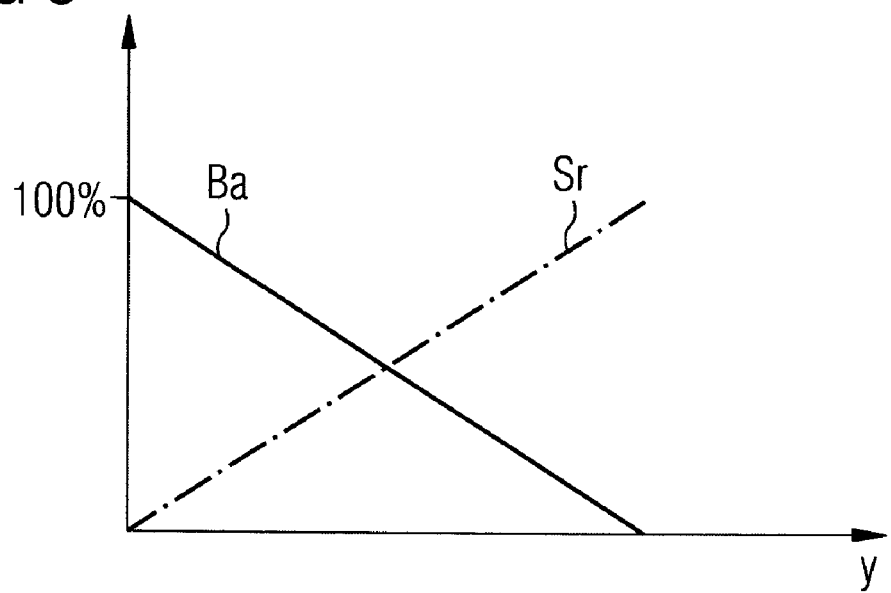
FIG. 5 illustrates the construction of the compensation zone in the case of a second exemplary embodiment.

Referring to FIG. 5, in the case of a compensation zone 30 comprising barium strontium titanate (BST), there is also the possibility of continuously varying the proportion of barium (Ba) and strontium (Sr), the layer that directly adjoins the drift zone 11 comprising ST, for example, and the thin layer present on that side of the layer stack which is remote from the drift zone 11 comprising BT, for example. Such a compensation zone 30 having a continuously varying material composition may be achieved for example by continuously varying the material composition of the deposited medium over time during deposition of the compensation zone 30 at the trench side walls.

FIG. 6 shows as curve 3 the profile of the dielectric constant of a compensation zone in which the material composition is varied continuously from BST (0.5;0.5) through to BT over the thickness of the compensation zone. The profile of the material composition within this layer is illustrated in FIG. 5B.

The compensation—which takes place in the case of the power semiconductor component according to the invention—of dopant charges in the drift zone by polarization charges of the high-dielectric compensation zone 30 is advantageously combined with a further compensation effect brought about by the provision of a semiconductor zone 15 doped complementarily with respect to the drift zone 11. Such a semiconductor zone 15, which preferably adjoins the body zone 12, is designated by the reference symbol 15 in FIG. 1A. Said compensation zone 15 directly adjoins the high-dielectric compensation zone 30 in the example and is thereby arranged between said high-dielectric compensation zone 30 and the drift zone 11. It goes without saying, however, that said compensation zone 15 doped complementarily with respect to the drift zone 11 may also be arranged in a manner spaced apart from the high-dielectric compensation zone 30.

A compensation zone having a spatially varying temperature dependence of the dielectric constant is, of course, not restricted to application in a power MOSFET with a planar gate electrode, as is explained below on the basis of further exemplary embodiments of power components comprising such a compensation zone 30.

Figure 7:
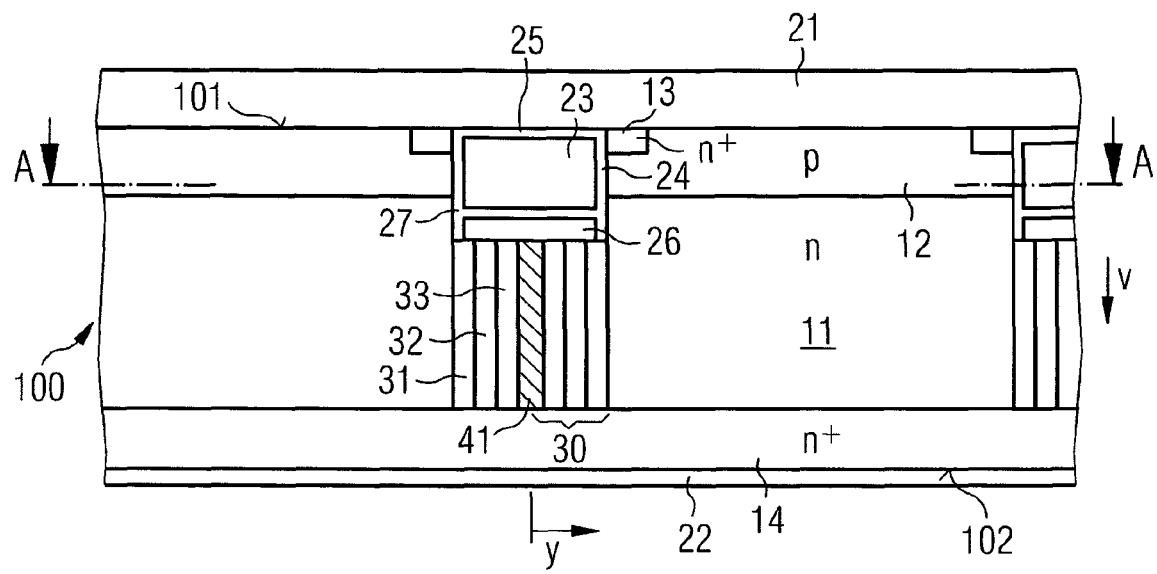
FIG. 7 shows a modification of the power MOSFET illustrated in FIG. 1, in which a gate electrode is arranged in a trench above the compensation zone.

FIG. 7 shows a power semiconductor component according to the invention that is embodied as a trench MOSFET. This trench MOSFET differs from the power MOSFET illustrated in FIG. 1A by virtue of the fact that the gate electrode 23 is arranged in the trench above the compensation zone 30. In this case, the source zone 13 and the body zone 12 are arranged adjacent to the gate electrode 23 in the lateral direction y. When the component is driven in the on state, an inversion channel in this case forms in the vertical direction v along the gate dielectric 24 that insulates the gate electrode 23 from the semiconductor body 100. In the case of this component, the source electrode 21 is arranged above the front side 101 of the semiconductor body, where it contact-connects the source zone 13 and the body zone 12 that reaches in sections as far as the front side 101. The gate electrode 23 is insulated from the source electrode 21 by means of a further insulation layer 25.

An electrode layer 26 is present between the gate electrode 23 and the compensation zone 31, which electrode layer contact-connects the compensation zone 30 and is at source potential, by way of example. For this purpose, said electrode layer 26 is connected to the source electrode 21 in a manner not specifically illustrated. An insulation layer 27 insulates said electrode layer 26 from the gate electrode 23 and the drift zone 11. As an alternative, the compensation zone 30 can be connected directly to the gate electrode 23, that is to say to gate potential (not illustrated).

Figure 8:
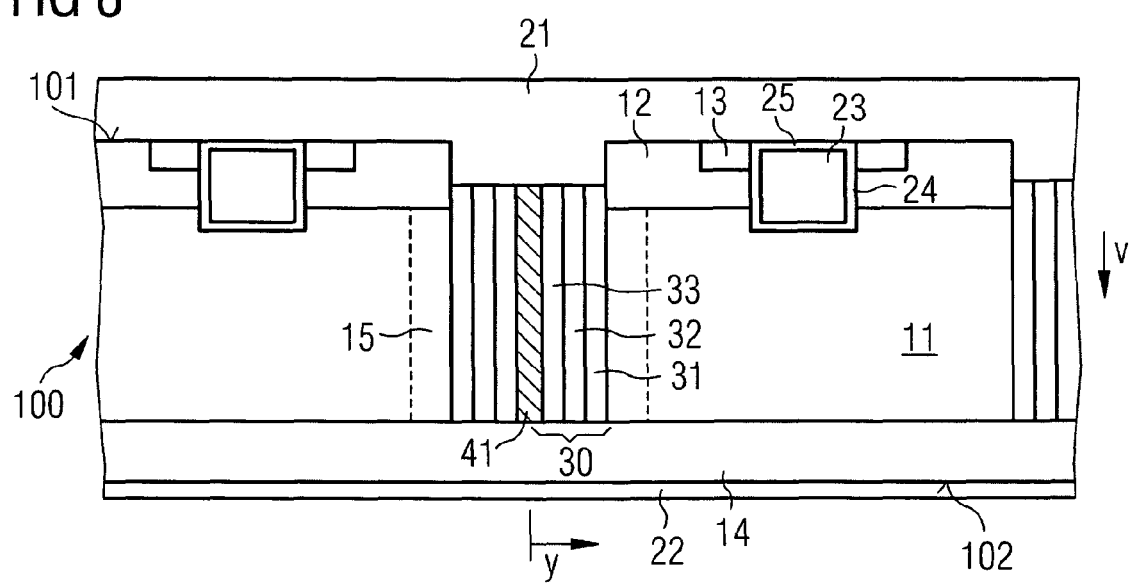
FIG. 8 shows a power MOSFET according to the invention, the gate electrode of which is arranged in a trench in a manner laterally spaced apart from the trench with the compensation zone.

FIG. 8 shows a modification of the trench MOSFET illustrated in FIG. 7. In the case of this trench MOSFET, the gate electrode 23 is arranged in a trench that extends proceeding from the front side 101 through the source zone 13 and the body zone 12 right into the drift zone 11 and is arranged in a manner spaced apart from the trench with the compensation zone 30 in the lateral direction y of the semiconductor body. In the case of this component, the source electrode 21 contact-connects the compensation zone 30 above the trench in which said compensation zone 30 is arranged, and also the body zone 12 and the source zone 13 in the region of the front side 101 of the semiconductor body. An insulation layer 25 insulates the gate electrode 23 in the region of the front side 101 of the semiconductor body from the source electrode 21.

Figure 9A:
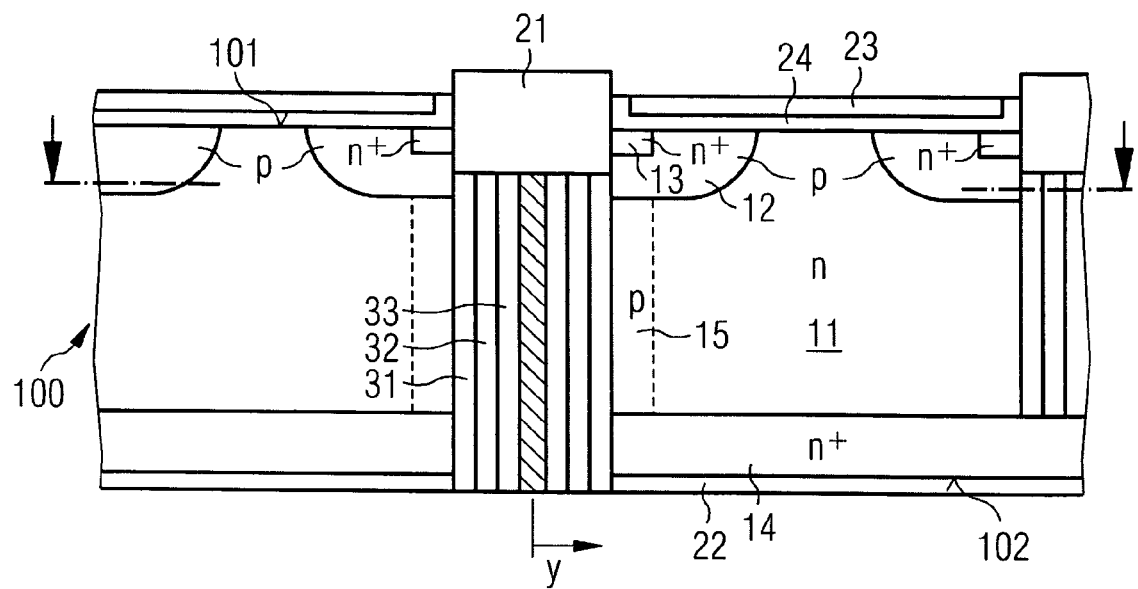
FIG. 9 shows a power MOSFET according to the invention in which a trench with the compensation zone extends as far as a rear side of the semiconductor body.

FIG. 9 shows a modification of the power MOSFET illustrated in FIG. 1, in which a cutout at whose side walls the compensation zone 30 is arranged reaches as far as the rear side 102 of the semiconductor body. In this case, the layer stack is contact-connected by the drain zone 14 adjoining the stack of the compensation zone 30 in the lateral direction.

Figure 9B:
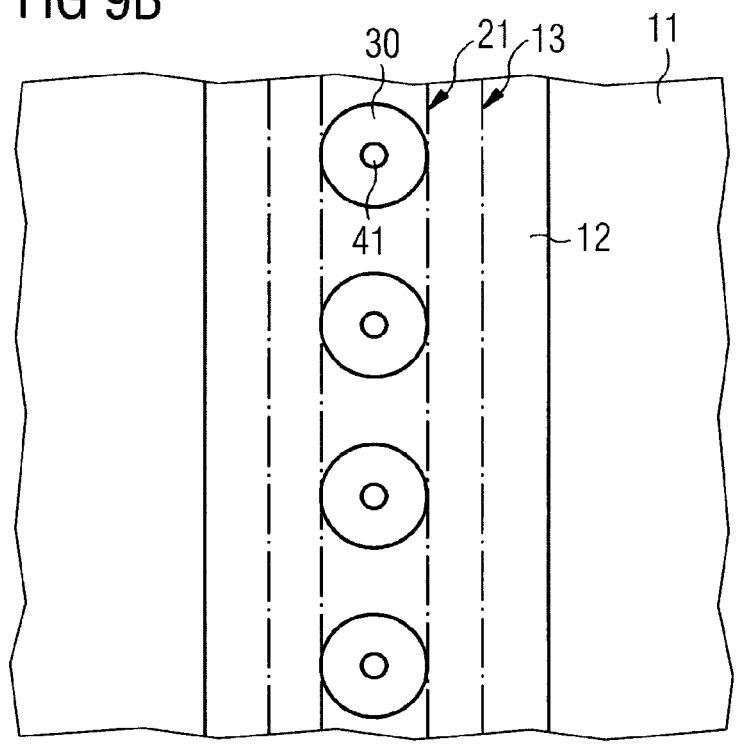

In this case, the cutout is cylindrical, in particular, in which case, referring to FIG. 9B, in the case of a strip-type cell geometry of the transistor, that is to say in the case of strip-type body and source zones, a plurality of such cylindrical cutouts can be arranged adjacent alongside one another. The production of such cutouts which reach as far as the rear side 102 of the semiconductor body and at the side walls of which a high-dielectric or ferroelectric material is applied may be effected for example by means of the method described in Morrison et al.: "Ferroelectric Nanotubes", Rev. Adv. Mater. Sci. 4 (2003), pages 114-122.

FIG. 9B illustrates the position of a plurality of cylindrical cutouts having a compensation zone at the side walls and, using dash-dotted lines, the position of the source zone 13 and, respectively, the source electrode 21 that contact-connects the compensation zone. In the region in which no cutouts are present, the source electrode 21 exclusively contact-connects the body zone or source zone. Instead of only one "row" of cylindrical cutouts (as illustrated), it is also possible, of course, to provide a plurality of rows of such cylindrical cutouts having a compensation zone that are arranged one behind another (not illustrated).

Figure 10:
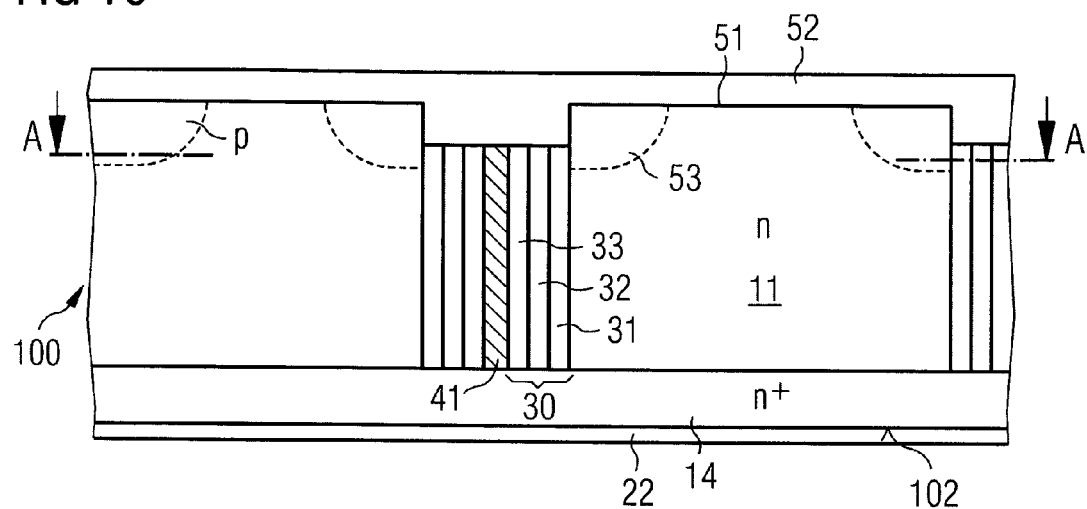
FIG. 10 shows a cross section through a power semiconductor component according to the invention realized as a vertical Schottky diode.

FIG. 10 shows a vertical power semiconductor component embodied as a Schottky diode. This Schottky diode has a Schottky metal 52, which forms the anode connection of the diode and which forms a Schottky junction 51 with the drift zone 11 of the component, proceeding from which Schottky junction a space charge zone forms in the drift zone 11 upon application of a blocking voltage. The highly doped semiconductor zone 14 of the same conductivity type as the drift zone 11, said semiconductor zone adjoining the drift zone 11, forms a cathode zone in the case of this component. In this case, the Schottky metal layer 52 contact-connects the compensation zone 30 extending along the drift zone 11. Optionally, semiconductor zones 53 doped complementarily with respect to the drift zone 11 are present in the drift zone 11, said semiconductor zones adjoining the trenches with the compensation zones 30 in the lateral direction in the region of the front side 101. Said semiconductor zones reduce the electric field strength in these regions of the semiconductor body in which the semiconductor body has edges due to the production of the trenches with the compensation zones arranged therein.

Figure 11:
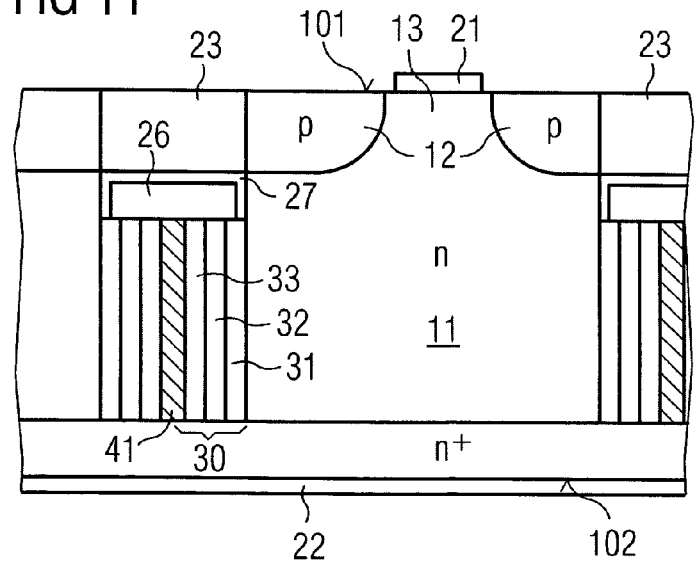
FIG. 11 shows a power semiconductor component realized as a JFET.

FIG. 11 shows a vertical semiconductor component embodied as a junction FET (JFET). This component differs from the MOSFETs explained above by virtue of the fact that the gate electrode 23 contact-connects a depletion layer zone that is arranged in the drift zone 11, doped complementarily with respect to the drift zone 11 and forms a pn junction with the drift zone 11. The source electrode 21 of the component contact-connects a section of the drift zone 11 which reaches as far as the front side and which forms the source zone 13 there. In this component, two depletion layer zones 12 arranged in a manner spaced apart from one another in the lateral direction serve, given suitable driving, to pinch off a conductive channel of the drift zone 11 in the direction of the front side 101 in order thereby to turn off the component.

In this component, the compensation zone 30 is contact-connected by an electrode layer 26, which is insulated from the drift zone 11 and the gate electrode 23 by an insulation layer 27 and which is at source potential, that is to say the potential of the source electrode 21. As an alternative, said electrode layer 26 may also be connected to the gate electrode 23.

Figure 12:
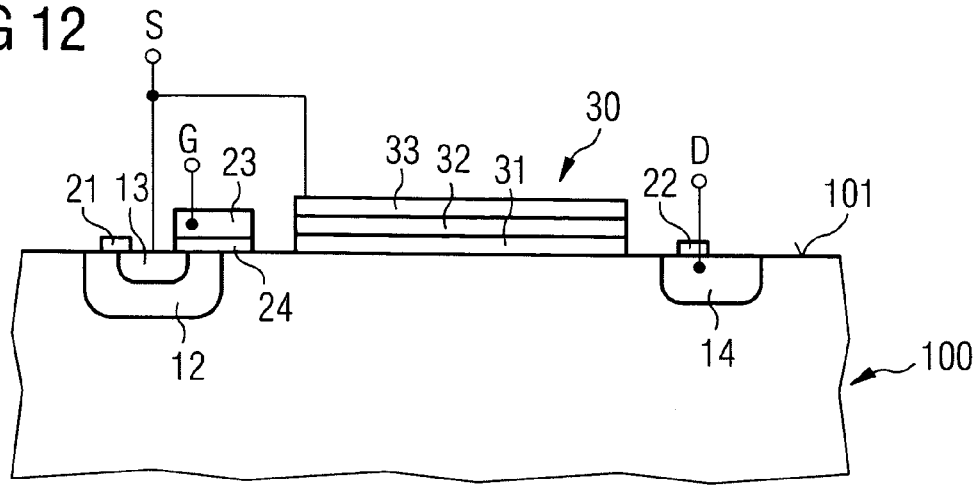
FIG. 12 shows a power semiconductor component realized as a lateral power transistor, in which the compensation zone is arranged above a front side of a semiconductor body.

FIG. 12 shows a power semiconductor component according to the invention that is embodied as a lateral power transistor. In this component, the source zone 13 and the drain zone 14 are arranged in a manner spaced apart from one another in a lateral direction of the semiconductor body 100. Correspondingly, in this component the drift zone 11 extends in the lateral direction of the semiconductor body 100. The source zone 13 is embedded in the body zone 12, which thereby separates the source zone 13 from the drift zone 11. In the component in accordance with FIG. 12, the gate electrode 23, which controls an inversion channel in the body zone 12 between the source zone 13 and the drift zone 11, is arranged above the front side 101 of the semiconductor body and is insulated from the semiconductor body 100 by the gate dielectric 24.

In this component, the layer stack of the compensation zone 30 having at least two layers 31-33 whose dielectric constants have different temperature dependencies is likewise arranged above the front side 101 of the semiconductor body, the individual layers 31-33 being arranged adjacent to one another in the vertical direction of the semiconductor body 100.

Figure 13A:
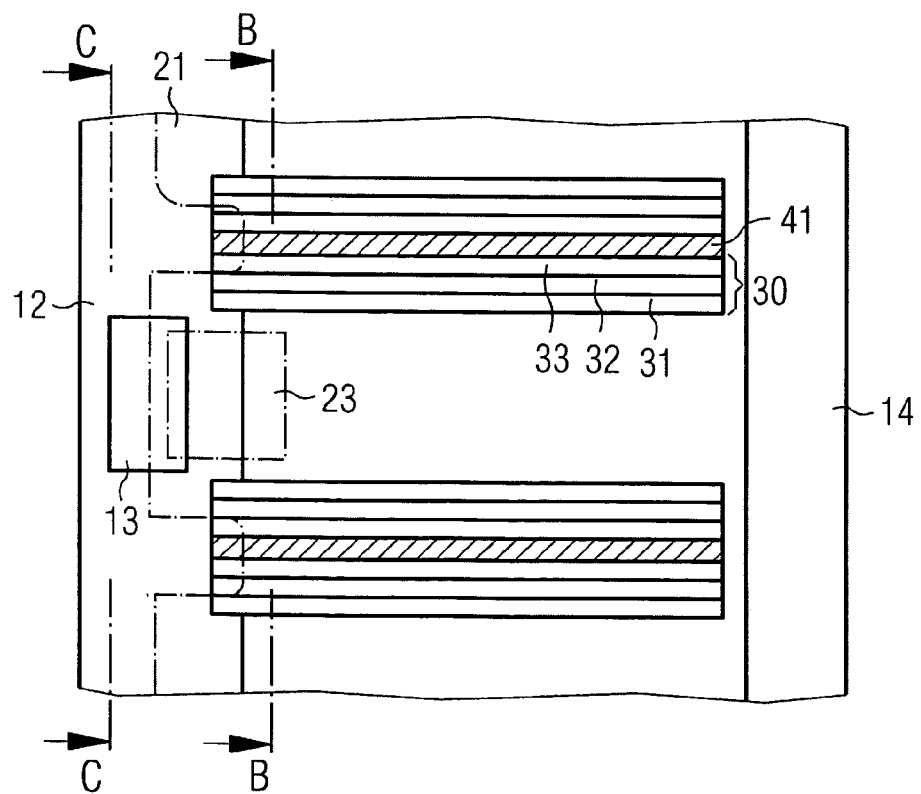
FIG. 13 shows a lateral power transistor in which the compensation zone is arranged in trenches extending in the lateral direction of the semiconductor body.

FIG. 13 shows a further example of the realization of a lateral power transistor according to the invention. A plurality of trenches with compensation zones 30 arranged therein are present in this component, said trenches extending adjacent to the drift zone 11 in a lateral direction of the semiconductor body 100. In this component, the body zone 12 and the drain zone 14 extend in a further lateral direction of the semiconductor body, running perpendicular to the longitudinal direction of the trenches with the compensation zones 30 arranged therein. The gate electrode 23 is arranged above the semiconductor body and extends in the extending direction of the trenches with the compensation zones 30 arranged therein from the source zone 13 over the body zone 12 as far as the drift zone 11. FIG. 13A shows such a power MOSFET as an excerpt in plan view.

Figure 13B:
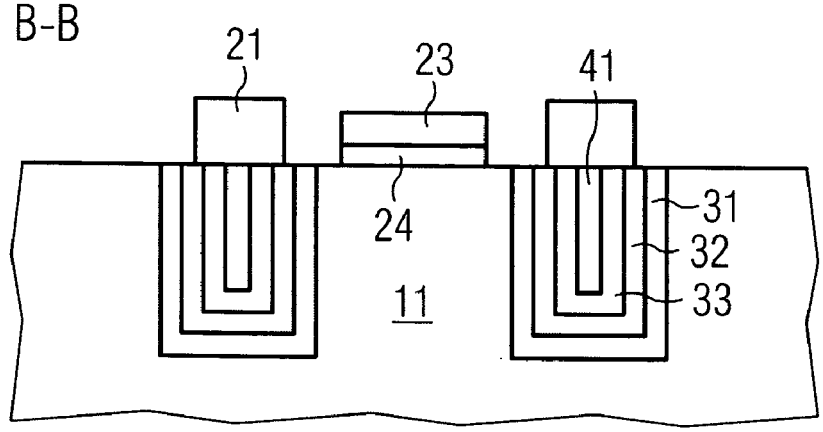
Figure 13C:
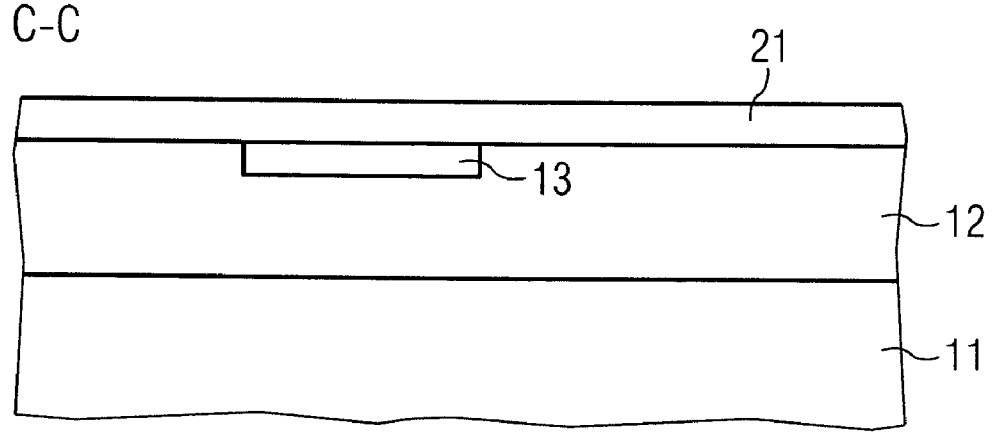

FIG. 13B shows a cross section through the drift zone with the compensation zone arranged therein. FIG. 13C shows a cross section through the body zone with the source zone arranged therein and the source electrode that contact-connects the body zone 12 and the source zone 13.

As an alternative to the strip-type realization of the compensation zone 30 as illustrated in FIG. 13, there is also the possibility of providing cylindrical cutouts in the drift zone, the compensation zones being applied at the side walls of said cutouts. A contact-connection of said compensation zones can be effected by means of highly doped diffusion zones arranged for example in the region of the front side of the semiconductor body.

The high-dielectric compensation zone having a spatially varying temperature behavior of the dielectric constant as explained above may furthermore also be employed in IGBTs. Such an IGBT is obtained by doping the drain zone 14 complementarily with respect to the drift zone 11 in the case of the power MOSFET explained above. Said drain zone is also referred to as a p-type emitter or anode zone in the case of an IGBT.

The compensation zone with a spatially variable temperature behavior as explained above may furthermore also be used in bipolar diodes.

Depending on the temperature stability or temperature sensitivity of the high-dielectric materials used, there is the possibility of realizing the compensation zone 30 only after the conclusion of the method steps for producing the individual component zones. This is explained below for the power MOSFET in accordance with FIG. 1A.

Figure 14A:
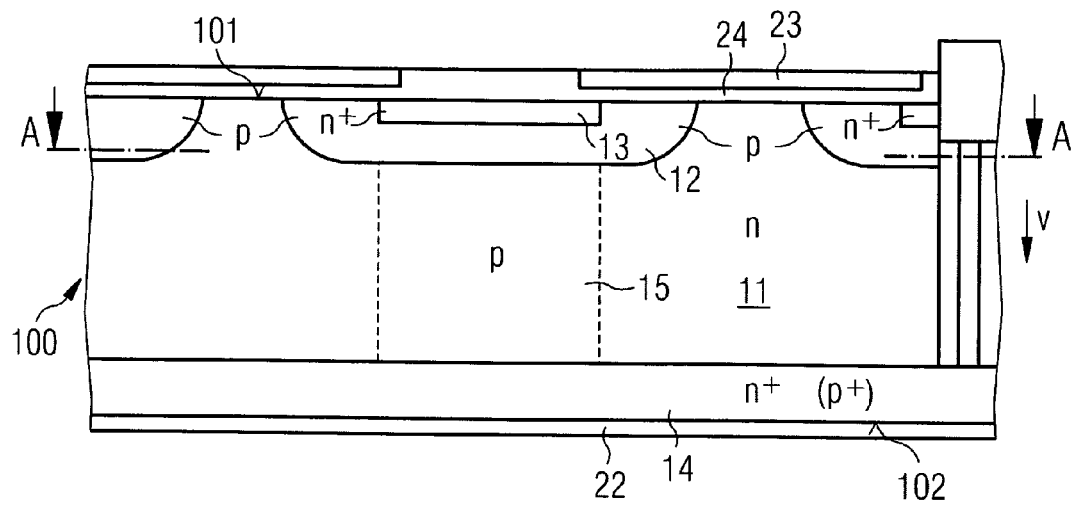
FIG. 14 illustrates one possible method for producing a compensation zone having a high-dielectric material.
Figure 14B:
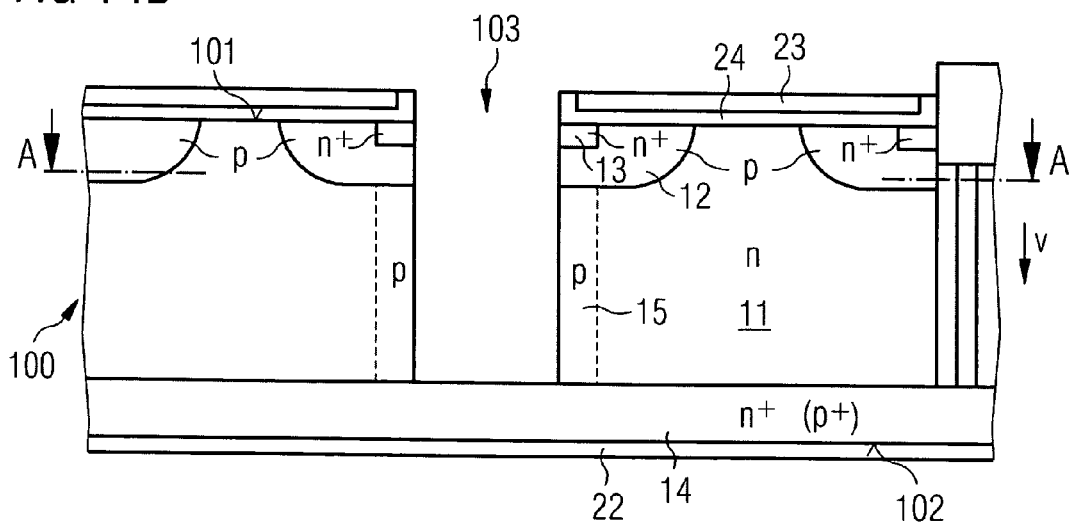
Figure 14C:
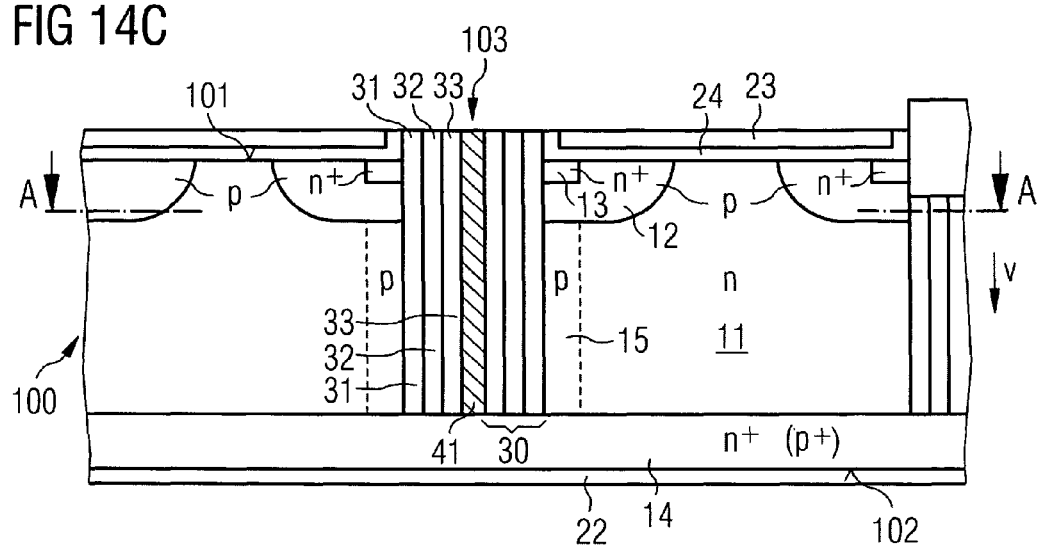

FIG. 14 shows the power MOSFET in cross section after the conclusion of the method steps carried out for producing the body zone 12, the source zone 13, the gate dielectric 24 and the gate electrode 23. Said method steps may comprise conventional DMOS processes in which the source zone 13 and the body zone 12 are produced using the gate electrode 23 having cutouts as a mask. In the region of the cutout of said gate electrode 21, a cutout is subsequently etched which may be formed for example in elongate trench-type or cylindrical fashion and which reaches as far as the drain zone 14. The compensation zone 30 is subsequently produced at the side walls of said cutout, for example by means of a CSD method, by depositing individual layers of high-dielectric materials which differ in terms of the temperature dependence of their respective dielectric constants. Said layers may be BST layers, for example, which differ in each case in terms of their stoichiometry, that is to say with regard to their proportion of barium and strontium, and which therefore have different temperature dependencies of the dielectric constants. If appropriate, the trenches can subsequently be filled with a filling material (41 in FIG. 1A). The component is illustrated after the conclusion of these method steps in FIG. 14C.

Afterward, the high-dielectric material and, if appropriate, the filling material is etched back to below the front side 101 of the semiconductor body 100 in order thereby to uncover the source zone 13 and the body zone 12 at the side walls of the trench. Finally, the source electrode 21 is produced, which contact-connects the source zone 13 and the body zone 12 at the side walls of the trench. FIG. 1 shows the component after the conclusion of these method steps.

Figure 15A:
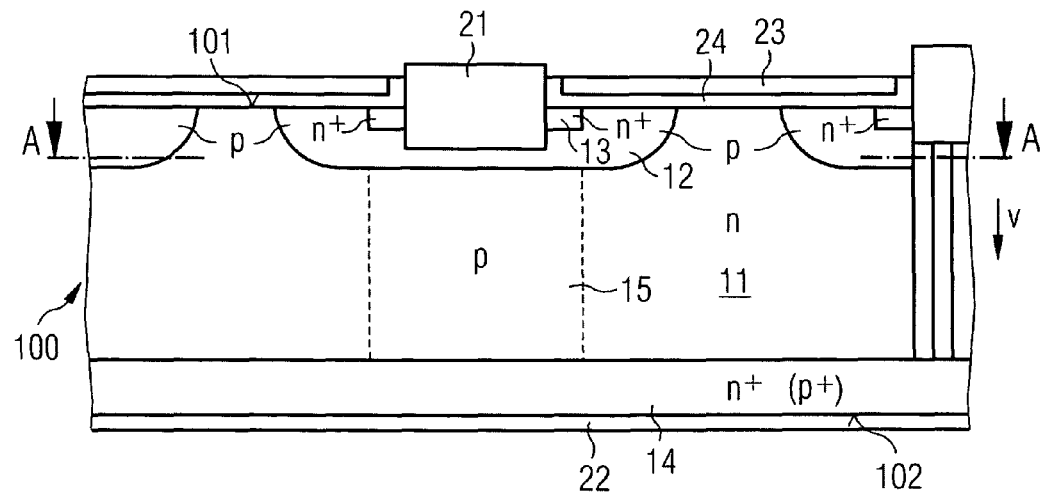
FIG. 15 illustrates a further method for producing a compensation zone having a high-dielectric material.
Figure 15B:
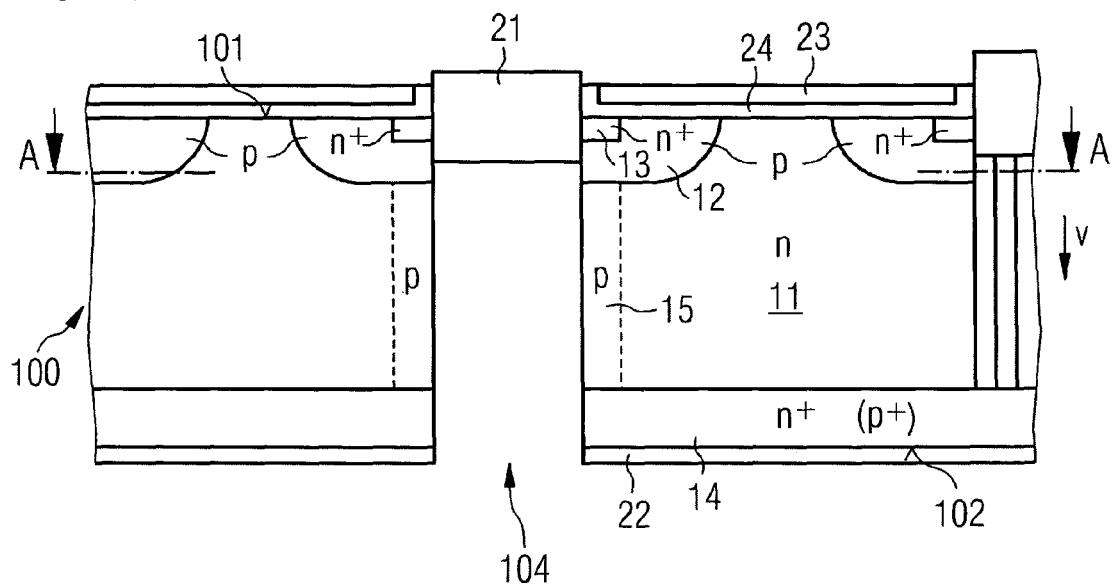
Figure 15C:
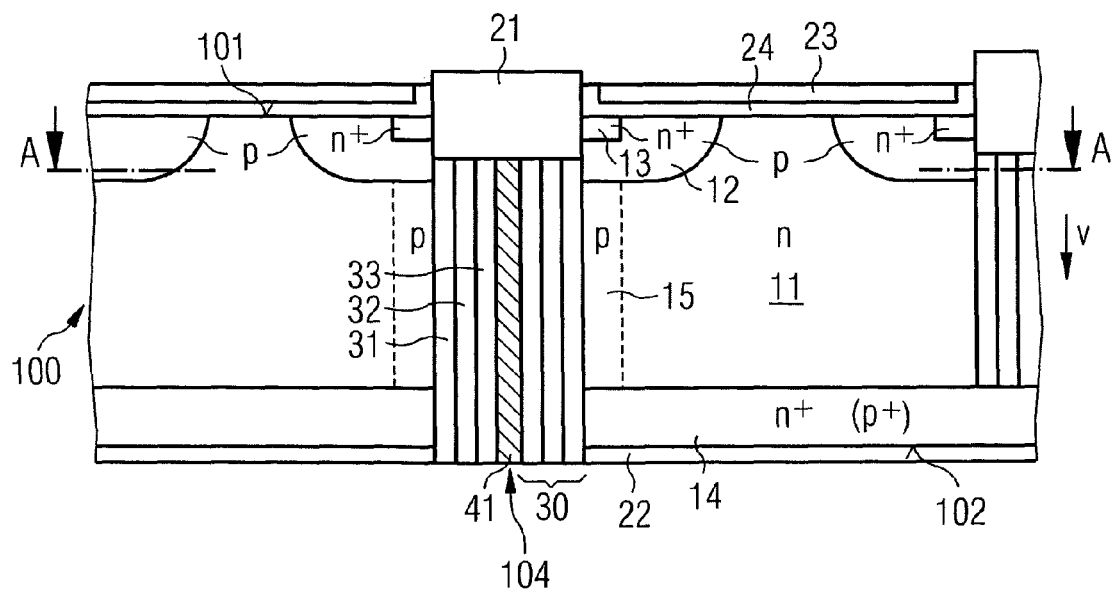

Referring to FIGS. 15A to 15C, there is alternatively also the possibility of producing the source electrode 21 before the compensation zone 30 is actually produced, of then etching the trench for the deposition of the compensation zone 30 into the semiconductor body 100 via the rear side 102, however, in a manner aligned with the position of the source electrode 21 via the rear side 102, and of subsequently depositing the layers of the compensation zone 30 at the side walls of the cutout.

In the case of high-dielectric materials that withstand the temperatures applied during the production of the component zones of the power MOSFET, there is also the possibility, of course, of producing the compensation zone before or together with the processes for producing the individual component zones.

The invention claimed is:

1. A power semiconductor component comprising:
   a semiconductor body with a drift zone of a first conductivity type,
   a component junction between the drift zone and a further component zone, which is configured such that when a blocking voltage is applied to the component junction, a space charge zone forms extending generally in a first direction in the drift zone,
   a compensation zone disposed adjacent to the drift zone in a second direction and including at least one high-dielectric material having a temperature-dependent dielectric constant, the temperature dependence of the dielectric constant varying in the second direction,
   wherein the compensation zone comprises at least two sections arranged adjacent to one another in the second direction, the at least two sections each having a temperature-dependent dielectric constant with the at least two sections having a mutually opposite temperature behavior of their dielectric constant.

2. The power semiconductor component as claimed in claim 1, wherein the compensation zone has at least one layer stack having at least two adjacent layers, each of the at least two adjacent layers having a dielectric constant, the dielectric constants of the at least two adjacent layers having different temperature dependencies.

3. The power semiconductor component as claimed in claim 2, wherein each layer has a high-dielectric material.

4. The power semiconductor component as claimed in claim 2, wherein the compensation zone has at least two layer stacks, each of the at least two layer stacks having at least two layers.

5. The power semiconductor component as claimed in claim 1, wherein the high-dielectric material includes a composite material whose composition changes substantially continuously in the second direction.

6. The power semiconductor component as claimed in claim 1 wherein the high-dielectric material is a perovskite ceramic.

7. The power semiconductor component as claimed in claim 2, wherein the layer stack has three layers, a first of the three layers comprising $BaTiO_3$, a second of the three layers comprising $Ba_{0.5}Sr_{0.5}TiO_3$, and a third of the layers comprising $SrTiO_3$.

8. The power semiconductor component as claimed in claim 5, in which the compensation zone comprises $Ba_{1-x}Sr_xTiO_3$.

9. The power semiconductor component as claimed in claim 1, in which the relative permittivity of the compensation zone within a temperature range of between 200 K and 450 K is greater than 50.

10. The power semiconductor component as claimed in claim 9, in which the relative permittivity of the compensation zone within a temperature range of between 200 K and 450 K is greater than 100.

11. The power semiconductor component as claimed in claim 1, in which a dielectric layer is disposed between the compensation zone and the drift zone.

12. The power semiconductor component as claimed in claim 1, further comprising a further compensation zone doped complementarily with respect to the drift zone, the further compensation zone disposed in the drift zone.

13. The power semiconductor component as claimed in claim 12, in which the further compensation zone is arranged between the compensation zone and the drift zone.

14. The power semiconductor component as claimed in claim 1, wherein the further component zone comprises a body zone doped complementarily with respect to the drift zone, and further comprising:
   a drain zone, which adjoins the drift zone at a side remote from the body zone;
   a source zone spaced apart from the drift zone, and
   a gate electrode.

15. The power semiconductor component as claimed in claim 14, in which the gate electrode and the compensation zone are arranged adjacent to one another in the first direction in a common trench and are insulated from one another by a dielectric layer.

16. The power semiconductor component as claimed in claim 14, in which the gate electrode is arranged as a planar electrode above a first side of the semiconductor body.

17. The power semiconductor component as claimed in claim 1, which is embodied as a power Schottky diode, in which the further component zone is a Schottky metal zone and which has a cathode zone.

18. The power semiconductor component as claimed in claim 1, which is embodied as a vertical component, in which the drift zone and the further component zone are arranged adjacent to one another in a vertical direction of the semiconductor body.

19. The power semiconductor component as claimed in claim 1, which is embodied as a lateral component, in which the drift zone and the further component zone are arranged adjacent to one another in a lateral direction of the semiconductor body.

20. The power semiconductor component as claimed in claim 1, in which the compensation zone is potential coupled to the further component zone.

21. The power semiconductor of claim 1, wherein the temperature dependence of the dielectric constant varies in dependence on position in a direction defined by the second direction.

* * * * *